(12) United States Patent
Kim et al.

(10) Patent No.: US 10,001,858 B2
(45) Date of Patent: Jun. 19, 2018

(54) SUBSTRATE INCLUDING THIN FILM TRANSISTOR FOR TOUCH DISPLAY

(71) Applicant: LG DISPLAY CO., LTD., Seoul (KR)

(72) Inventors: Min-Joo Kim, Seoul (KR); Seung-Hee Nam, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 5 days.

(21) Appl. No.: 15/222,589

(22) Filed: Jul. 28, 2016

(65) Prior Publication Data

US 2017/0031489 A1 Feb. 2, 2017

(30) Foreign Application Priority Data

Jul. 28, 2015 (KR) .......................... 10-2015-0106341

(51) Int. Cl.
| | | |
|---|---|---|
| *G06F 3/041* | (2006.01) | |
| *H01L 27/12* | (2006.01) | |
| *H01L 29/786* | (2006.01) | |
| *H01L 29/51* | (2006.01) | |
| *G06F 3/044* | (2006.01) | |
| *G06F 3/047* | (2006.01) | |
| *G02F 1/1333* | (2006.01) | |

(52) U.S. Cl.
CPC ........ *G06F 3/0412* (2013.01); *G02F 1/13338* (2013.01); *G02F 1/133345* (2013.01); *G06F 3/044* (2013.01); *G06F 3/047* (2013.01); *G06F 3/0416* (2013.01); *H01L 27/124* (2013.01); *H01L 27/1225* (2013.01); *H01L 29/518* (2013.01); *H01L 29/7869* (2013.01); *G02F 2001/133357* (2013.01); *G02F 2201/121* (2013.01)

(58) Field of Classification Search
CPC ...... G06F 3/0412; G06F 3/0416; G06F 3/044; G06F 3/047; G02F 1/13338; G02F 1/133514; G02F 1/31419; G02F 1/1369; G02F 2201/133357; G02F 2201/121; G02F 2201/123; H01L 27/1225; H01L 27/124; H01L 29/518; H01L 29/7869
See application file for complete search history.

(56) References Cited

U.S. PATENT DOCUMENTS

| | | | | |
|---|---|---|---|---|
| 2014/0131699 | A1* | 5/2014 | Youn | H01L 29/66742 257/43 |
| 2015/0076501 | A1* | 3/2015 | Hayashi | H01L 27/124 257/72 |
| 2016/0274693 | A1* | 9/2016 | Liu | G06F 3/044 |

* cited by examiner

*Primary Examiner* — Lisa Landis
(74) *Attorney, Agent, or Firm* — Birch, Stewart, Kolasch & Birch, LLP

(57) ABSTRACT

A substrate can include a thin film transistor for a touch display, which is capable of preventing oxidation of a touch connection electrode. In the substrate including a thin film transistor, an inorganic insulation film for covering a side surface of a planarization film, which exposes a touch sensing line, is formed of a material different from that of the planarization film, and a touch connection electrode is located on a side surface of the inorganic insulation film.

14 Claims, 5 Drawing Sheets

SUBSTRATE INCLUDING THIN FILM TRANSISTOR FOR TOUCH DISPLAY

CROSS REFERENCE TO RELATED APPLICATIONS

This application claims the priority benefit of Korean Patent Application No. 10-2015-0106341, filed on Jul. 28, 2015, which is hereby incorporated by reference as if fully set forth herein.

BACKGROUND OF THE INVENTION

Field of the Invention

The present invention relates to a substrate including a thin film transistor for a touch display, and more particularly, to a substrate including a thin film transistor for a touch display, which may prevent oxidation of a touch connection electrode.

Discussion of the Related Art

The development of various portable electronic appliances, such as mobile communication terminals and notebook computers, has increased the demand for flat panel displays for application to the portable electronic appliances. Among such flat panel displays, the application fields of a liquid crystal display are becoming more diverse owing to several advantages including the development of mass production technologies, ease of driving means, low power consumption, and the realization of high resolution and a large screen.

In recent years, as an input device for a liquid crystal display, a touch screen, which allows a user to directly input information to a screen using the fingers or a pen, has been applied to supplant a conventionally applied input device, such as a mouse or keyboard. When the touch screen is applied to a liquid crystal display, in order to reduce the thickness thereof, development is underway with the aim of incorporating the touch screen in a substrate including a thin film transistor for a liquid crystal panel. At this time, an in-cell touch type liquid crystal display, in which a common electrode, formed on the substrate including a thin film transistor, is utilized as a touch sensing electrode, and a touch sensing line for interconnecting common electrodes formed in respective pixels is formed separately, is being developed.

Such a conventional in-cell touch type liquid crystal display includes a touch connection electrode for connecting the touch sensing line and the common electrode to each other. At this time, when the touch connection electrode is in contact with an insulation film that includes oxygen, the touch connection electrode is oxidized, causing deterioration in reliability.

SUMMARY OF THE INVENTION

Accordingly, the present invention is directed to a substrate including a thin film transistor for a touch display that substantially obviates one or more problems due to limitations and disadvantages of the related art.

An object of the present invention is to provide a substrate including a thin film transistor for a touch display, which may prevent oxidation of a touch connection electrode.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, in a substrate including a thin film transistor in accordance with an aspect of the present invention, an inorganic insulation film for covering a side surface of a planarization film, which exposes a touch sensing line, is formed of a material different from that of the planarization film, and a touch connection electrode is located on a side surface of the inorganic insulation film.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Hereinafter, the embodiments in accordance with the present invention will be described in detail with reference to the accompanying drawings.

Figure 1:
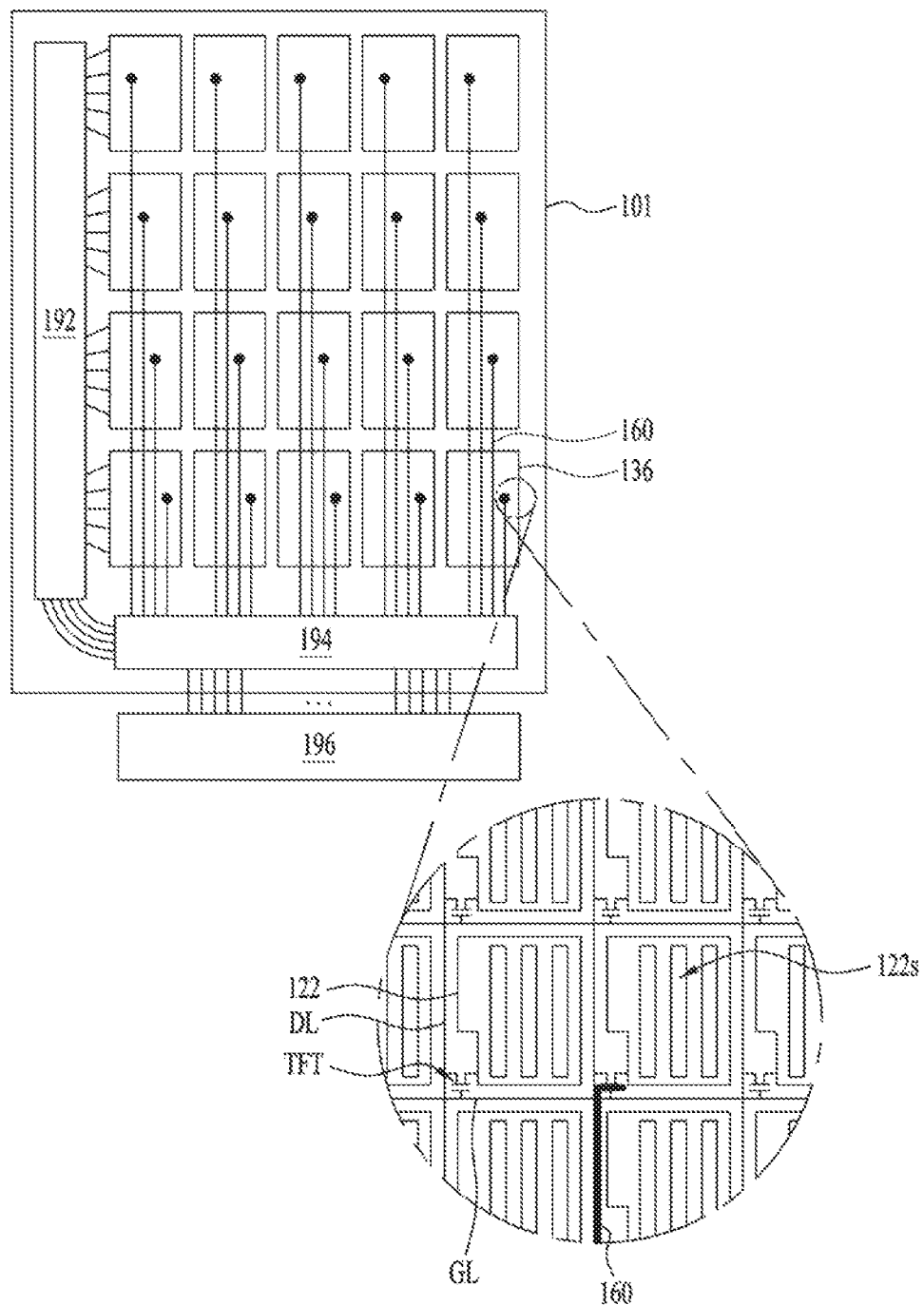
FIG. 1 is a view illustrating a touch display in accordance with one or more embodiments of the present invention.

FIG. 1 is a block diagram illustrating a touch display in accordance with one or more embodiments of the present invention. All the components of the touch display according to all embodiments of the present invention are operatively coupled and configured.

The touch display illustrated in FIG. 1 includes a data driver 194, a gate driver 192, a touch driver 196, and a display panel.

The data driver 194 converts digital data from a timing controller into an analogue data voltage in response to a data control signal from the timing controller, and supplies the analogue data voltage to data lines DL.

The gate driver 192 sequentially drives gate lines GL of the display panel in response to a gate control signal from the timing controller. The gate driver 192 supplies the scan pulse of a gate-on voltage for every corresponding scan period of each gate line GL, and supplies a gate-off voltage for the remaining period during which the other gate lines GL are driven. The gate driver 192 is formed in a non-display area on one side or both sides of a substrate 101, simultaneously with the manufacture of a thin film transistor (TFT) of each pixel.

The touch driver 196 is connected to a touch sensing line 160 of the display panel, and receives a user touch signal from the touch sensing line 160. The touch driver 196 detects whether or not a user touch is input and a touch position by sensing variation in capacitance attributable to the user touch.

The display panel displays an image using a plurality of pixels arranged in a matrix form. When a liquid crystal panel is used as the display panel, the display panel includes a substrate including a color filter, a substrate including a thin film transistor, and a liquid crystal layer between the substrate including a color filter and the substrate including a thin film transistor.

Figure 2:
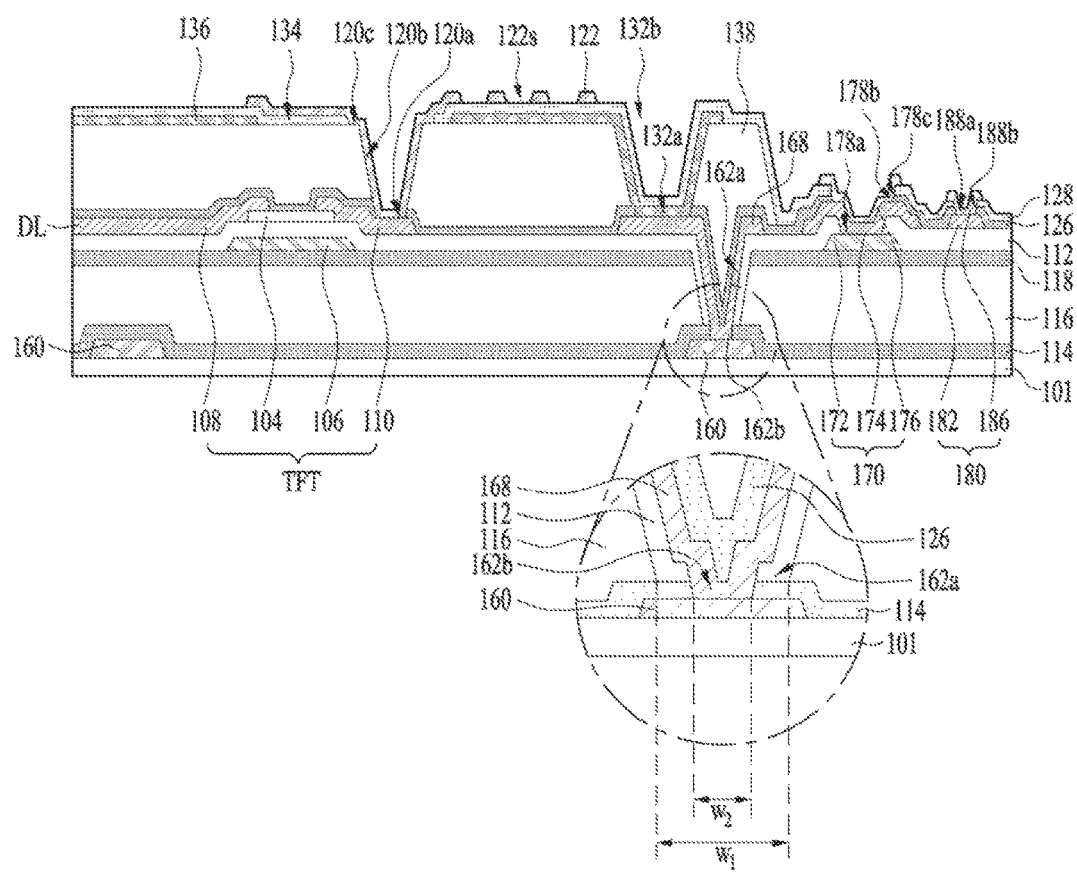
FIG. 2 is a sectional view illustrating a first embodiment of a substrate including a thin film transistor for the touch display illustrated in FIG. 1.

The substrate including a thin film transistor, as illustrated in FIGS. 1 and 2, is provided with a thin film transistor TFT formed at an intersection of the gate line GL and the data line DL, a pixel electrode 122, a common electrode 136, and a touch sensing line 160.

The thin film transistor TFT charges the pixel electrode 122 with a data signal of the data line DL in response to a scan signal of the gate line GL, and maintains the pixel electrode 122 charged with the data signal. To this end, the thin film transistor TFT includes a gate electrode 106, a source electrode 108, a drain electrode 110, and an active layer 104 as illustrated in FIG. 2.

The gate electrode 106 may be a single layer or multiple layers formed on a second anti-oxidation film 118 using any one selected from among molybdenum (Mo), aluminum (Al), chrome (Cr), gold (Au), titanium (Ti), nickel (Ni), neodymium (Nd) and copper (Cu), or alloys thereof, without being limited thereto. For example, the gate electrode 106 may be a stack of Cu and MoTi.

A gate signal is supplied to the gate electrode 106 through a gate pad 170, which is connected to the gate line GL.

The gate pad 170 includes a gate lower electrode 172, a gate intermediate electrode 174, and a gate upper electrode 176. The gate lower electrode 172 is formed on the second anti-oxidation film 118 using the same material as the gate electrode 106. The gate intermediate electrode 174 is electrically connected to the gate lower electrode 172, which is exposed through a first gate contact hole 178a penetrating a gate insulation film 112. The gate intermediate electrode 174 is formed on the gate insulation film 112 using the same material as the source and drain electrodes 108 and 110. The gate upper electrode 176 is electrically connected to the gate intermediate electrode 174, which is exposed through a second gate contact hole 178b penetrating a first protective film 126 and a third gate contact hole 178c penetrating a second protective film 128. Here, the line width of the third gate contact hole 178c is equal to or greater than the line width of the second gate contact hole 178b. The gate upper electrode 176 is formed of the same material as the pixel electrode 122, for example, ITO, IZO or ITZO, which has strong corrosion-resistance and acid-resistance.

The active layer 104 is formed on the gate insulation film 112 to have a back channel etch (BCE) structure, thus forming a channel between the source and drain electrodes 108 and 110. The active layer 104 is formed of one or more oxide semiconductors selected from among InZnO, InGaZnO, InSnZnO, HfZnInO, InGaO, ZnO, InAlZnO, and ZnSnO.

The source electrode 108 may be a single layer or multiple layers formed on the gate insulation film 112 using any one selected from among molybdenum (Mo), aluminum (Al), chrome (Cr), gold (Au), titanium (Ti), nickel (Ni), neodymium (Nd) and copper (Cu), or alloys thereof, without being limited thereto. For example, the source electrode 108 may be a stack of Cu and MoTi.

The data signal is supplied to the source electrode 108 through a data pad 180 connected to the data line DL.

The data pad 180 includes a data lower electrode 182 and a data upper electrode 186. The data lower electrode 182 is formed on the gate insulation film 112 using the same material as the source and drain electrodes 108 and 110. The data upper electrode 186 is electrically connected to the data lower electrode 182, which is exposed through a first data contact hole 188a penetrating the first protective film 126 and a second data contact hole 188b penetrating the second protective film 128. Here, the line width of the second data contact hole 188b is equal to or greater than the line width of the first data contact hole 188a. The data upper electrode 186 is formed of the same material as the pixel electrode 122, for example, ITO, IZO or ITZO, which has strong corrosion-resistance and acid-resistance.

The drain electrode 110 faces the source electrode 108 with the channel of the active layer 104 interposed therebetween, and is formed of the same material as the source electrode 108. The drain electrode 110 is exposed through a first pixel contact hole 120a penetrating the first protective film 126, a second pixel contact hole 120b penetrating a second planarization film 138, and a third pixel contact hole 120c penetrating the second protective film 128 and is connected to the pixel electrode 122.

The pixel electrode 122 is formed on the second protective film 128 in each pixel area, which is defined by the gate line GL and the data line DL crossing each other, to have a plurality of slits 122s. The pixel electrode 122 is electrically connected to the drain electrode 110, which is exposed through the first to third pixel contact holes 120a, 120b and 120c.

The common electrode 136 is formed on the second planarization film 138. Here, the common electrode 136 has an opening 134, which has a greater width than the first to third pixel contact holes 120a, 120b and 120c, in a region overlapping the first to third pixel contact holes 120a, 120b and 120c. The common electrode 136 overlaps the pixel electrode 122 in each pixel area with the second protective film 128 interposed therebetween. As such, the common electrode 136, to which a common voltage is supplied for a period during which an image is displayed, forms a fringe electric field in cooperation with the pixel electrode 122, to which a pixel voltage signal is supplied. Liquid crystal molecules, which are arranged between the thin film transistor substrate and a color filter substrate by the fringe electric field, are rotated by dielectric anisotropy. In addition, the transmittance of light passing through the pixel area changes depending on the degree of rotation of liquid crystal molecules, whereby gradation is realized.

Figure 3:
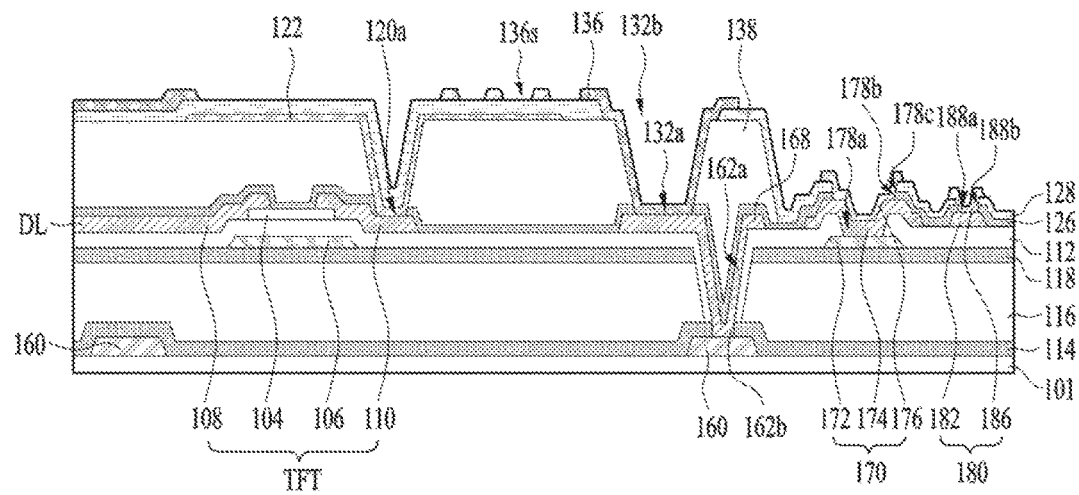
FIG. 3 is a sectional view illustrating another form of a common electrode and a pixel electrode illustrated in FIG. 2.

Meanwhile, although FIG. 2 illustrates the structure in which the pixel electrode 122 is formed on the second protective film 128 to have the slits 122s and the common electrode 136 is formed in a plate form on the second planarization film 138 by way of example, alternatively, the pixel electrode 122 may be formed in a plate form on the second planarization film 138 and the common electrode 136 may be formed on the second protective film 128 to have a plurality of slits 136s, as illustrated in FIG. 3.

In addition, the common electrode 136 serves as a sensing electrode, which senses a user touch position for a touch sensing period, which is a non-display period during which no image is displayed. To this end, a plurality of common electrodes 136 is spaced apart from each other by a prescribed distance on the substrate 101 as illustrated in FIG. 1. Each of the common electrodes 136 has a size corresponding to at least one pixel area in consideration of the area of the user touch. The common electrode 136 is electrically connected to the touch sensing line 160 through a touch connection electrode 168. As such, when the user touches a display area, touch capacitance is generated between the common electrodes 136. The position of the user touch is detected by comparing the touch capacitance in response to the user touch with a reference capacitance, and an operation depending on the detected touch position is performed.

To this end, the touch sensing line 160 transmits a user touch signal, sensed by the common electrode 136, to the touch driver 196. The touch sensing line 160, as illustrated in FIG. 2, may be a single layer or multiple layers formed on the substrate 101 using any one selected from among molybdenum (Mo), aluminum (Al), chrome (Cr), gold (Au), titanium (Ti), nickel (Ni), neodymium (Nd) and copper (Cu), or alloys thereof, without being limited thereto. For example, the touch sensing line 160 may be a stack of Cu and MoTi.

A first anti-oxidation film 114, a first planarization film 116, and the second anti-oxidation film 118 are stacked one above another in sequence between the touch sensing line 160, the gate electrode 106 and the gate line GL.

The first planarization film 116 is formed using an inorganic insulation film having a low dielectric constant in order to reduce parasitic capacitance between the touch sensing line 160 and each of the gate line GL and the data line DL. For example, the first planarization film 116 is formed by coating a liquid-phase spin on glass (SOG) material including oxygen, such as at least one of $TiO_2$, $SiO_2$, $H_2O$, $CH_3CH_2OH$ and $(CH_3)_2CHOH$, via any one of spray coating, spin coating, slit coating, and inkjet printing. In addition, the first planarization film 116 may be formed using a photosensitive or non-photosensitive organic insulation film having a low dielectric constant.

The first anti-oxidation film 114 is formed between the first planarization film 116 and the touch sensing line 160 using an inorganic insulation film not including oxygen (O), for example, SiNx. As such, the first anti-oxidation film 114 may prevent the touch sensing line 160 from coming into contact with the first planarization film 116, thereby preventing the touch sensing line 160 from being oxidized by the oxygen (O) included in the first planarization film 116.

The second anti-oxidation film 118 is formed between the first planarization film 116 and each of the gate electrode 106, the gate line GL and the gate lower electrode 172 using an inorganic insulation film not including oxygen (O), for example, SiNx. As such, the second anti-oxidation film 114 may prevent each of the gate electrode 106, the gate line GL and the gate lower electrode 172 from coming into contact with the first planarization film 116, thereby preventing each of the gate electrode 106, the gate line GL and the gate lower electrode 172 from being oxidized by the oxygen (O) included in the first planarization film 116.

The touch connection electrode 168 may be a single layer or multiple layers formed on the gate insulation film 112 using any one selected from among molybdenum (Mo), aluminum (Al), chrome (Cr), gold (Au), titanium (Ti), nickel (Ni), neodymium (Nd) and copper (Cu), or alloys thereof, without being limited thereto. For example, the touch connection electrode 168 may be formed of the same material as the source electrode 108, which is a stack of Cu and MoTi.

The touch connection electrode 168 is electrically connected to the touch sensing line 160, which is exposed through a first touch contact hole 162a penetrating the first planarization film 116 and the second anti-oxidation film 118, and a second touch contact hole 162b penetrating the first anti-oxidation film 114 and the gate insulation film 112. At this time, the line width w2 of the second touch contact hole 162b is smaller than the line width w1 of the first touch contact hole 162a. The gate insulation film 112 having the second touch contact hole 162b is formed to cover the side surface of the first planarization film 116, which is exposed through the first touch contact hole 162a. Here, the gate insulation film 112 is formed using the same material as the first and second anti-oxidation films 114 and 118, i.e. an inorganic insulation film not including oxygen (O). For example, the gate insulation film 112 is formed in a dual structure including a nitride silicon (SiNx) film, which is formed to cover the gate electrode 106, and an oxide silicon (SiOx) film formed on the nitride silicon film. As such, the gate insulation film 112 may prevent the touch connection electrode 168 from coming into contact with the side surface of the first planarization film 116, thereby preventing the touch connection electrode 168 from being oxidized by the oxygen (O) included in the first planarization film 116.

Figure 4:
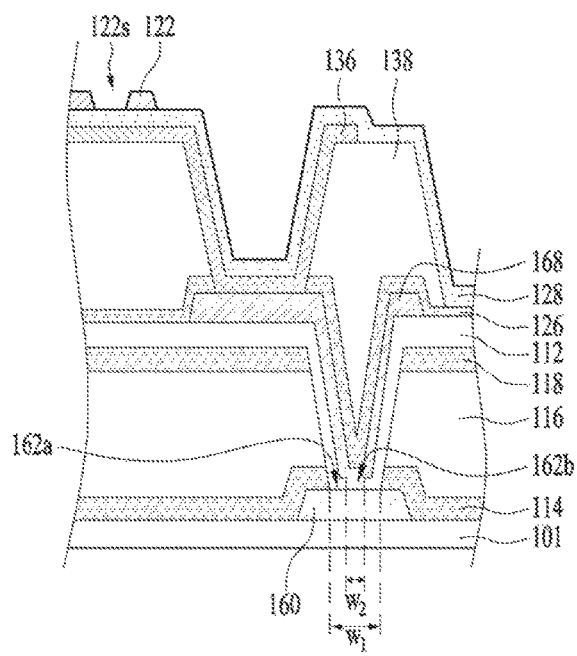
FIG. 4 is a sectional view illustrating another form of a first anti-oxidation film illustrated in FIG. 2.

Meanwhile, the first and second touch contact holes 162a and 162b may have a structure illustrated in FIG. 4, rather than the structure illustrated in FIG. 2. The first touch contact hole 162a is formed to penetrate the first anti-oxidation film 114, the first planarization film 116, and the second anti-oxidation film 118, and the second touch contact hole 162b is formed to penetrate the gate insulation film 112. Even in this case, because the gate insulation film 112 having the second touch contact hole 162b is formed to cover the side surface of the first planarization film 116, which is exposed through the first touch contact hole 162a, the gate insulation film 112 may prevent the touch connection electrode 168 from being oxidized by the oxygen (O) included in the first planarization film 116.

In addition, the touch connection electrode 168 is exposed through a first common contact hole 132a penetrating the first protective film 126 and a second common contact hole 132b penetrating the second planarization film 138, and is electrically connected to the common electrode 136.

As described above, in the first embodiment of the present invention, the gate insulation film 112 is formed to cover the side surface of the first planarization film 116, which is exposed through the first touch contact hole 162a, thereby preventing the touch connection electrode 168 from being oxidized by the oxygen (O) included in the first planarization film 116.

Meanwhile, because a defect of variation in brightness, attributable to a rubbing tail, may occur due to a height difference between the distal end of the second planarization film 138 on the touch sensing line 160 and each of the gate pad 170 and the data pad 180, an alignment film performs polyimide (PI) rubbing alignment or ultraviolet (UV) light alignment.

Figure 5:
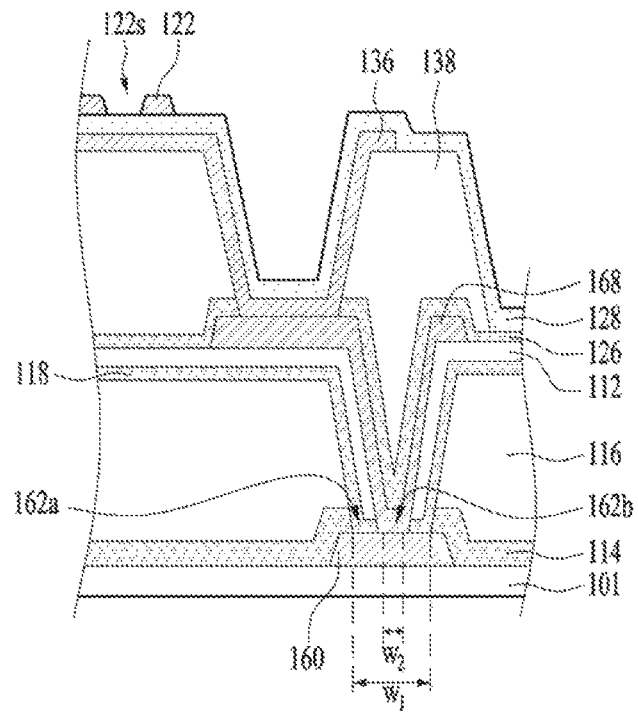
FIG. 5 is a sectional view illustrating a second embodiment of a substrate including a thin film transistor for the touch display illustrated in FIG. 1.

FIG. 5 is a sectional view illustrating a substrate including a thin film transistor in accordance with a second embodiment of the present invention.

The substrate including a thin film transistor illustrated in FIG. 5 includes the same constituent elements as the substrate including a thin film transistor illustrated in FIG. 2, except that the second anti-oxidation film 118 is formed to cover the side surface of the first planarization film 116, which is exposed through the first touch contact hole 162*a*. Thus, a detailed description related to the same constituent elements will be omitted below.

The touch connection electrode 168 illustrated in FIG. 5 is electrically connected to the touch sensing line 160, which is exposed through the first touch contact hole 162*a* penetrating the first anti-oxidation film 114 and the first planarization film 116 and the second touch contact hole 162*b* penetrating the second anti-oxidation film 118 and the gate insulation film 112. At this time, the line width w2 of the second touch contact hole 162*b* is smaller than the line width w1 of the first touch contact hole 162*a*. The second anti-oxidation film 118 having the second touch contact hole 162*b* is formed to cover the side surface of the first planarization film 116, which is exposed through the first touch contact hole 162*a*. As such, the second anti-oxidation film 118, which is formed using an inorganic insulation film not including oxygen (O), may prevent the touch connection electrode 168 from coming into contact with the side surface of the first planarization film 116, thereby preventing the touch connection electrode 168 from being oxidized by oxygen (O) included in the first planarization film 116.

Figure 6:
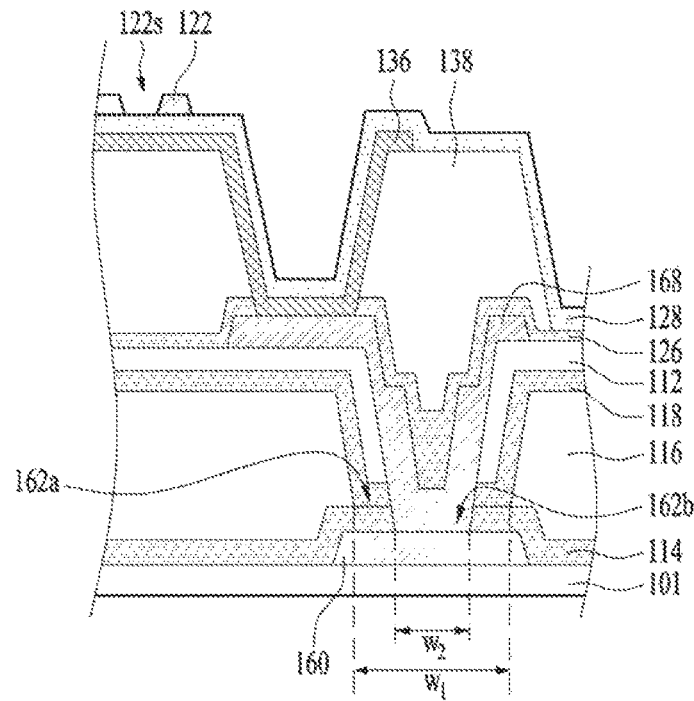
FIG. 6 is a sectional view illustrating another form of a first anti-oxidation film illustrated in FIG. 5.

Meanwhile, the first and second touch contact holes 162*a* and 162*b* may have the structure illustrated in FIG. 6, rather than the structure illustrated in FIG. 5. The first touch contact hole 162*a* is formed to penetrate the first planarization film 116, and the second touch contact hole 162*b* is formed to penetrate the first and second anti-oxidation films 114 and 118 and the gate insulation film 112. Even in this case, because the second anti-oxidation film 118 having the second touch contact hole 162*b* is formed to cover the side surface of the first planarization film 116, which is exposed through the first touch contact hole 162*a*, the second anti-oxidation film 118 may prevent the touch connection electrode 168 from being oxidized by oxygen (O) included in the first planarization film 116.

Figure 7:
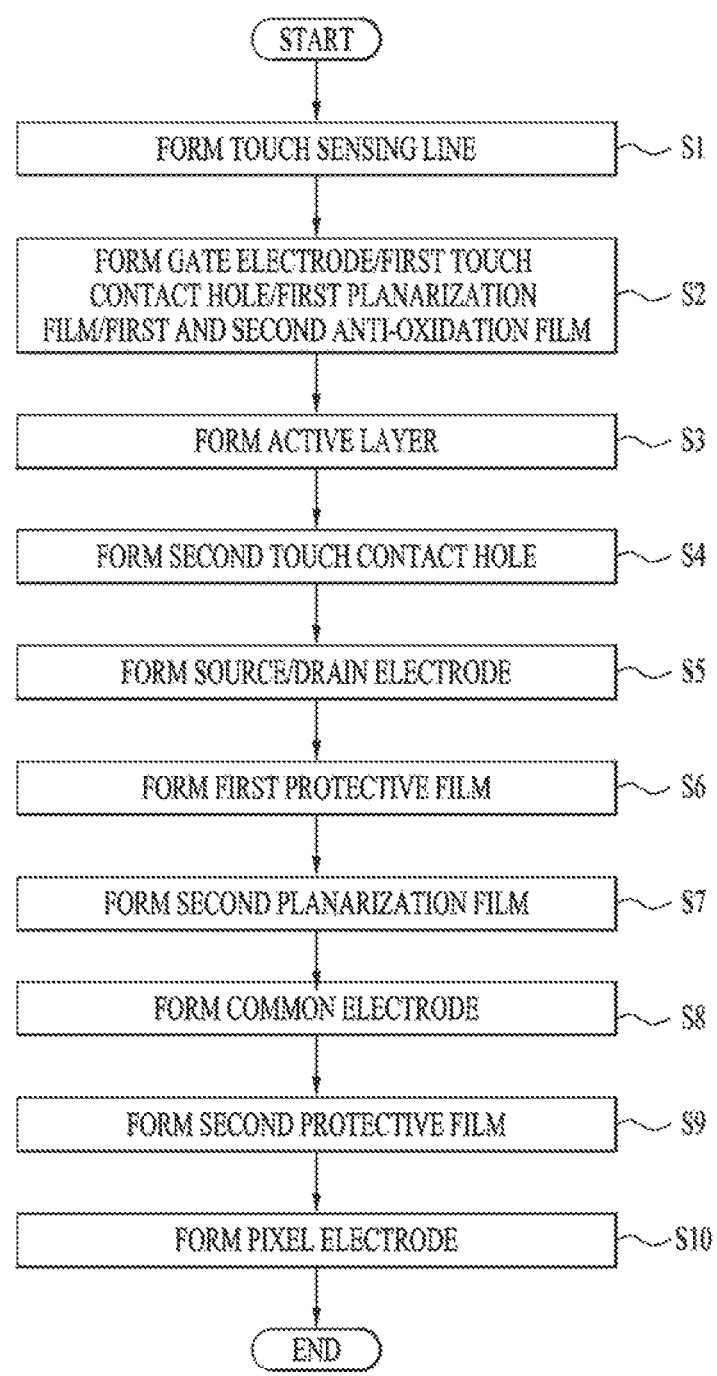
FIG. 7 is a flowchart illustrating a method of manufacturing the substrate including a thin film transistor illustrated in FIG. 2 according to an embodiment of the present invention.

FIG. 7 is a flowchart illustrating a method of manufacturing the substrate including a thin film transistor illustrated in FIG. 2.

Referring to FIG. 7, first, the touch sensing line 160 is formed on the substrate 101 via a first mask process (step S1). Then, after the first anti-oxidation film 114, the first planarization film 116, and the second anti-oxidation film 118 are formed throughout the substrate 101 on which the touch sensing line 160 has been formed, the first touch contact hole 162*a*, which penetrates the first planarization film 116 and the second anti-oxidation film 118, is formed via a second mask process, and then the gate electrode 106 and the gate lower electrode 172 are formed on the second anti-oxidation film 118 (step S2). Meanwhile, only a portion of the first planarization film 116 may be removed when the first touch contact hole 162*a* is formed, and the remaining portion of the first planarization film 116 may be completely etched when the second touch contact hole 162 is subsequently formed. In addition, when the first touch contact hole 162*a* is formed, a portion of the first anti-oxidation film 114 located under the first planarization film 116 may also be etched. Then, the gate insulation film 112 is formed to cover the gate electrode 106 and the gate lower electrode 162, and the active layer 104 is formed on the gate insulation film 112 via a third mask process (step S3). Subsequently, the second touch contact hole 162*b*, which penetrates the gate insulation film 112 and the first anti-oxidation film 114, and the first gate contact hole 178*a*, which penetrates the gate insulation film 112, are formed via a fourth mask process (step S4). Subsequently, the source and drain electrodes 108 and 110, the touch connection electrode 168, the gate intermediate electrode 174, and the data lower electrode 182 are formed via a fifth mask process (step S5). Subsequently, the first protective film 126, which has the first pixel contact hole 120*a*, the first common contact hole 132*a*, the second gate contact hole 178*b*, and the first data contact hole 188*a*, is formed via a sixth mask process (step S6). Subsequently, the second planarization film 138, which has the second pixel contact hole 120*b* and the second common contact hole 132*b*, is formed on the first protective film 126 via a seventh mask process (step S7). Subsequently, the common electrode 136, which has the opening 134, is formed via an eighth mask process (step S8). Subsequently, the second protective film 128, which has the third pixel contact hole 120*c*, the third gate contact hole 138*c*, and the second data contact hole 188*b*, is formed via a ninth mask process (step S9). Subsequently, the pixel electrode 122, the gate upper electrode 176, and the data upper electrode 186 are formed via a tenth mask process (step S10).

Meanwhile, the substrate including a thin film transistor illustrated in FIG. 4 is provided with the first touch contact hole 162*a*, which penetrates the first anti-oxidation film 114, the first planarization film 116 and the second anti-oxidation film 118, in the second mask process, and is provided with the second touch contact hole 162*b*, which penetrates the gate insulation film 112, in the fourth mask process, and the other mask processes are performed in the same manner as those illustrated in FIG. 7.

In addition, the substrate including a thin film transistor illustrated in FIG. 5 is provided with the first touch contact hole 162*a*, which penetrates the first anti-oxidation film 114 and the first planarization film 116, in the second mask process, and is provided with the second touch contact hole 162*b*, which penetrates the second anti-oxidation film 118 and the gate insulation film 112, in the fourth mask process, and the other mask processes are performed in the same manner as those illustrated in FIG. 7.

As described above, in the present invention, a gate pattern including the gate electrode 106 and the gate lower electrode 172, and the first and second anti-oxidation films 114 and 118 and the first planarization film 116, which have the first and second touch contact holes 162*a* and 162*b*, are formed at the same time via a mask process using a half-tone mask or slit mask. Accordingly, the present invention may reduce at least one mask process compared to the related art, and thus may reduce costs and increase productivity compared to the related art.

Meanwhile, although the fringe field structure has been described by way of example in the present invention, for example, a horizontal field type structure may also be applied to all liquid crystal display panels in which a common electrode is formed on a substrate including a thin film transistor.

As is apparent from the above description, according to one or more embodiments of the present invention, a gate insulation film or a second anti-oxidation film is formed to cover the side surface of a first planarization film, which is exposed through a first touch contact hole, thereby preventing a touch connection electrode from being oxidized by oxygen included in the first planarization film, resulting in improved reliability. In addition, in one or more embodiments of the present invention, a gate pattern including a gate electrode and a gate lower electrode, and the first and second anti-oxidation films and the first planarization film, which have first and second touch contact holes, are formed at the same time via a mask process using a half-tone mask or slit mask. Accordingly, the embodiments of the present invention may reduce at least one mask process compared to the related art, and thus may reduce costs and increase productivity compared to the related art.

The above description is merely given to describe the present invention by way of example, and numerous modifications and embodiments can be devised by those skilled in the art that will fall within the spirit and scope of the principles of this disclosure. Accordingly, the embodiments disclosed in the specification of the present invention are not intended to limit the present invention. The scope of the present invention should be construed by the following claims, and all technologies and the invention is to cover all modifications, equivalents, and alternatives falling within the spirit and scope of the invention as defined by the claims.

What is claimed is:

1. A substrate including a thin film transistor for a touch display, the substrate comprising:
    a touch sensing line on a base substrate to be connected to a common electrode that is driven by a touch sensing electrode;
    a planarization film having a first touch contact hole for exposing the touch sensing line;
    an inorganic insulation film for covering a side surface of the planarization film exposed through the first touch contact hole, the inorganic insulation film being composed of a material different from that of the planarization film; and
    a touch connection electrode connected to the touch sensing line through a second touch contact hole that penetrates the inorganic insulation film.

2. The substrate according to claim 1, further comprising:
    a first anti-oxidation film located between the touch sensing line and the planarization film;
    a second anti-oxidation film on the planarization film;
    a thin film transistor on the second anti-oxidation film; and
    a gate insulation film located between a gate electrode of the thin film transistor and the touch connection electrode,
    wherein the inorganic insulation film is any one of the gate insulation film and the second anti-oxidation film.

3. The substrate according to claim 2, wherein the first touch contact hole penetrates the planarization film and the second anti-oxidation film,
    wherein the second touch contact hole has a smaller line width than the first touch contact hole, and penetrates the first anti-oxidation film and the gate insulation film, and
    wherein the gate insulation film covers the planarization film exposed through the first touch contact hole.

4. The substrate according to claim 2, wherein the first touch contact hole penetrates the first anti-oxidation film, the planarization film, and the second anti-oxidation film,
    wherein the second touch contact hole has a smaller line width than the first touch contact hole, and penetrates the gate insulation film, and
    wherein the gate insulation film covers the planarization film exposed through the first touch contact hole.

5. The substrate according to claim 2, wherein the first touch contact hole penetrates the first anti-oxidation film and the planarization film,
    wherein the second touch contact hole has a smaller line width than the first touch contact hole, and penetrates the second anti-oxidation film and the gate insulation film, and
    wherein the second anti-oxidation film covers the planarization film exposed through the first touch contact hole.

6. The substrate according to claim 2, wherein the first touch contact hole penetrates the planarization film,
    wherein the second touch contact hole has a smaller line width than the first touch contact hole, and penetrates the first anti-oxidation film, the second anti-oxidation film, and the gate insulation film, and
    wherein the second anti-oxidation film covers the planarization film exposed through the first touch contact hole.

7. The substrate according to claim 2, wherein the planarization film is formed of an inorganic insulation material including oxygen (O), and the first and second anti-oxidation films and the gate insulation film are formed of an inorganic insulation material including nitrogen (N).

8. The substrate according to claim 1, wherein the inorganic insulation film is interposed between the planarization film and the touch connection electrode.

9. A substrate including a thin film transistor for a touch display, the substrate comprising:
    a touch sensing line on a base substrate to be connected to a common electrode that is driven by a touch sensing electrode;
    a planarization film having a first touch contact hole for exposing the touch sensing line;
    an inorganic insulation film for covering a side surface of the planarization film exposed through the first touch contact hole, the inorganic insulation film being composed of a material different from that of the planarization film;
    a touch connection electrode connected to the touch sensing line through a second touch contact hole that penetrates the inorganic insulation film;
    a first anti-oxidation film located between the touch sensing line and the planarization film;
    a second anti-oxidation film on the planarization film;
    a thin film transistor on the second anti-oxidation film; and
    a gate insulation film located between a gate electrode of the thin film transistor and the touch connection electrode,
    wherein the inorganic insulation film is any one of the gate insulation film and the second anti-oxidation film.

10. The substrate according to claim 9, wherein the first touch contact hole penetrates the planarization film and the second anti-oxidation film,
    wherein the second touch contact hole has a smaller line width than the first touch contact hole, and penetrates the first anti-oxidation film and the gate insulation film, and
    wherein the gate insulation film covers the planarization film exposed through the first touch contact hole.

11. The substrate according to claim 9, wherein the first touch contact hole penetrates the first anti-oxidation film, the planarization film, and the second anti-oxidation film,
    wherein the second touch contact hole has a smaller line width than the first touch contact hole, and penetrates the gate insulation film, and
    wherein the gate insulation film covers the planarization film exposed through the first touch contact hole.

12. The substrate according to claim 9, wherein the first touch contact hole penetrates the first anti-oxidation film and the planarization film, wherein the second touch contact hole has a smaller line width than the first touch contact hole, and penetrates the second anti-oxidation film and the gate insulation film, and wherein the second anti-oxidation film covers the planarization film exposed through the first touch contact hole.

13. The substrate according to claim 9, wherein the first touch contact hole penetrates the planarization film, wherein the second touch contact hole has a smaller line width than the first touch contact hole, and penetrates the first anti-oxidation film, the second anti-oxidation film, and the gate insulation film, and wherein the second anti-oxidation film covers the planarization film exposed through the first touch contact hole.

14. The substrate according to claim 9, wherein the planarization film is formed of an inorganic insulation material including oxygen (O), and the first and second anti-oxidation films and the gate insulation film are formed of an inorganic insulation material including nitrogen (N).

* * * * *